United States Patent

Bakowski et al.

[11] Patent Number: 5,831,287
[45] Date of Patent: Nov. 3, 1998

[54] BIPOLAR SEMICONDUCTOR DEVICE HAVING SEMICONDUCTOR LAYERS OF SIC AND A METHOD FOR PRODUCING A SEMICONDUCTOR DEVICE OF SIC

[75] Inventors: Mietek Bakowski, Skultuna; Ulf Gustafsson, Linköping; Henry Bleichner, Uppsala, all of Sweden

[73] Assignee: ABB Research, Ltd., Zurich, Switzerland

[21] Appl. No.: 706,264

[22] Filed: Sep. 4, 1996

[51] Int. Cl.$^6$ .................................................. H01L 31/0312
[52] U.S. Cl. .................................................. 257/77; 257/76
[58] Field of Search ................................. 257/76, 77, 78, 257/154, 544

[56] References Cited

U.S. PATENT DOCUMENTS

| | | | |
|---|---|---|---|
| 3,972,749 | 8/1976 | Pavlichenko | 257/77 |
| 4,497,773 | 2/1985 | Kisinko et al. | 257/77 |
| 5,043,773 | 8/1991 | Precht et al. | 257/77 |
| 5,243,204 | 9/1993 | Suzuki et al. | 257/77 |
| 5,338,945 | 8/1994 | Baliga et al. | 257/77 |
| 5,385,855 | 1/1995 | Brown et al. | 437/41 |
| 5,396,085 | 3/1995 | Baliga | 257/77 |

*Primary Examiner*—Sara W. Crane
*Assistant Examiner*—Phat X. Cao

[57] ABSTRACT

A bipolar semiconductor comprising layers of SiC semiconductor material. At least one pn-junction is formed between two of the layers having charged carrier transport across the junction when the device is in a conductive state. A resistive element in series with the pn-junction lowers the current through the pn-junction as the voltage drop across the device increases with an increase in temperature. The temperature coefficient for the device switches from a negative to a positive at a lower current through the device.

14 Claims, 3 Drawing Sheets

BIPOLAR SEMICONDUCTOR DEVICE HAVING SEMICONDUCTOR LAYERS OF SIC AND A METHOD FOR PRODUCING A SEMICONDUCTOR DEVICE OF SIC

TECHNICAL FIELD

The present invention relates to a bipolar semiconductor device having semiconductor layers of SiC and at least one pn-junction with charge carrier transport thereacross between two subsequent such layers in a conducting forward state of the device, and also relates to a method for producing a semiconductor device of SiC.

This includes all bipolar devices, that is devices in which there will be a flow of minority charge carriers in the forward conducting state, such as for example an IGBT behaving like a MOS-FET in series with a diode in that state.

SUMMARY OF THE INVENTION

A disadvantage of known bipolar semiconductor devices having semiconductor layers of SiC is that they have a negative temperature coefficient of the on-state voltage drop-up to very high current densities due to the fact that SiC-devices require a much thinner drift region due to the high dielectric strength of SiC. Accordingly, the contribution of the resistive voltage drop of the n-type layer at the junction to the total on-state voltage will be relatively smaller in a bipolar device of SiC than in such a device of, for instance, Si. Thus, the diode relation $I(V)=I_o(e^{qV/kt}-1)$ will dominate the influence upon the total on-state voltage in a bipolar device of SiC until very high current densities are reached where the cross-over point where the temperature coefficient shifts from negative to positive is typically of the order of 1000 A/cm$^2$ in the case of SiC as compared to 50–100 A/Cm$^2$ in the Si case. This is illustrated in FIGS. 1 and 2, which show the current density J versus the total on-state voltage of corresponding bipolar devices of Si and SiC. The continuous line represents a temperature which is lower than that of the dashed line, and FIG. 1 indicates that the cross-over point will be at a much lower current density for Si than for SiC, for which, as indicated in FIG. 2, the lines in question for different temperatures will still run substantially in parallel with each other in the same current density region as the cross-over point for Si is located.

The reason for the great importance of securing a positive temperature coefficient of the on-state voltage drop at normal working current densities is that it is often necessary to connect several such bipolar devices, such as diodes, in parallel within one semiconductor chip, or to connect several small device chips in parallel with each other for realizing bipolar devices, such as IGBTs, being able to together conduct a current of a certain desired intensity at a given voltage. The following will happen if the temperature coefficient is negative: inherently different parts within the same device have different qualities and different devices connected in parallel with each other will also inevitably have different qualities with the result that the current density will not be totally uniform through a device and from one device to another, so that spots will be increased where the current density is higher. This will lead to a higher temperature in such spots with inevitably higher current density if the temperature coefficient is negative. The conditions will be the opposite for spots having a lower current density, so that the current will be concentrated to some hot spots and the device will be very unstable and may be destroyed. If on the other, the temperature coefficient is positive, said spots having a higher current density resulting in a higher temperature will get a higher resistance, so that the current density and the temperature will go down, resulting in a uniform current density and a stable operation of an assembly of such parallel-connected devices without risk of destruction by extremely high temperatures.

SUMMARY OF THE INVENTION

The object of the present invention is to provide a bipolar semiconductor device having semiconductor layers of SiC which will have stable operation at normal working current densities and which may be connected in parallel with other such devices to form an assembly for which a stable operation is secured at such working current densities.

This object according to the invention is obtained by providing such a device with a member having a resistance that substantially lowers the current as the voltage drop over the device increases with temperature and arranging this member in series with the pn-junction. Such extra resistance increases the contribution of the resistive voltage drop to the total on-state voltage drop over the device at normal working current densities, so that the temperature coefficient will shift from negative to positive at much lower current densities. It will, in this way, be possible to obtain a cross-over point where the temperature coefficient shifts from negative to positive for SiC in the same region as for Si. Thus, the member having a resistance will compensate for the band-gap change with the temperature in bipolar devices and take the voltage drop away from the pn-junction, so that a stable operation is secured at normal working current densities.

The definition that the member is arranged in series with said pn-junction does also include the arrangement of said member outside the very device, for instance in a line connecting the device to a potential.

According to a preferred embodiment of the invention, the member comprises an extra-layer of SiC built in by epitaxy in the device and having a considerable resistance with respect to the on-state resistance of the device. By forming such a so-called ballast resistance in the device itself, it is possible to increase in a simple way the contribution of the resistive voltage drop of the device to the total on-state voltage sufficiently to make the temperature coefficient of the device positive as of much lower current than without such an extra-layer.

This extra-layer needs to have a certain resistance and, according to another preferred embodiment of the invention, it is therefore made thick as seen in the direction of the current flow in the forward state of the device with respect to other layers of the device. This thickness is, according to another embodiment of the invention, over 200 μm and preferably over 300 μm. By making the extra-layer thick, it will be possible to keep the doping concentration in the layer at a moderate level which is desired, since it may be hard to produce such an extra-layer having an extremely low doping concentration when a substrate layer, from which the growth of the other layers is started, is used as the extra-layer. It will be advantageous to use the substrate as the extra-layer and, according to a preferred embodiment, the device has a doped n-type substrate layer, and the extra-layer is a sub-layer of the substrate layer. This definition also includes the extra-layer being identical to the substrate layer.

According to another preferred embodiment of the invention constituting a further development of the embodiment last mentioned, a highly doped n-type layer is arranged on top of the extra-layer for efficient charge injection into a low doped n-type drift layer of the device arranged on top of the highly doped layer and between the last mentioned layer and the pn-junction of the device. In fact the pn-junction will extend into the drift layer and that is intended to be covered by this definition. It is preferred to arrange such a highly doped n-type layer on top of the extra-layer, since the extra-layer has to have a comparatively low doping concentration in order to have the resistance required for substantially lowering the cross-over point of the temperature coefficient; this will mean that the injection of charges into the drift layer would be too inefficient should the drift layer be arranged directly on top of this extra-layer.

A method for producing a semiconductor device of SiC having a low doped drift layer and a highly doped layer placed next thereto for charge injection into the drift layer is, according to the invention, characterized in that the highly doped layer is epitaxyally grown on top of a doped substrate layer and the drift layer is epitaxyally grown on top of the highly doped layer. This method makes it possible to form the highly doped n-type layer on top of the extra-layer when such an extra-layer is present, which is very favorable, since the interference between the drift layer and the layer next thereto will as a result be of a much higher quality than if the drift layer were grown directly upon the substrate layer.

However, it must be emphasized that the latter method is not in any way restricted to the case in which an extra-layer having a considerable resistance with respect to the on-state resistance of the device is employed, but that it will be advantageous for all types of semiconductor devices having a doped substrate layer and a drift layer. This method overcomes the inconvenience that the total resistance per unit area in already known devices of SiC, is not given solely by the sum of the resistance represented by the drift layer, the substrate layer and the contacts of the device, but also an interface resistance increasing the total voltage drop for a certain current. A lower crystal quality in the vicinity of the interface will decrease the injection efficiency of the highly doped layer of n-type as well as of p-type, if a p-type layer is regrown, and further increase the drift layer resistance due to a higher electron-hole recombination process in this region, i.e., a shorter carrier lift time. By producing said highly doped layer by epitaxyally growing it on top of a substrate layer the interface between this layer and the drift layer will be of a much higher quality than if the substrate layer were used, as if said highly doped layer and the drift layer were grown on top thereof. It is important to point out that the function of the highly doped layer on top of the substrate layer is to act as the active injecting-emitter, i.e., the substrate will only be used as a device carrier.

According to a highly preferred embodiment of the invention, the highly doped layer and the drift layer are grown on top of the substrate layer in the same growth run. This makes it possible to obtain a very high quality of the interface between these two layers, resulting in the advantages mentioned above.

According to another preferred embodiment of the device according to the invention, the resistance member has a resistivity of about 0.04 Ωcm. Such resistivity has turned out to be suitable for obtaining a positive temperature coefficient of the on-state voltage drop at normal working current densities of bipolar semiconductor devices of SiC.

According to another preferred embodiment of the invention, the extra-layer is a layer of another material than SiC placed on one end of the device as seen in the direction of the current flow through the device in the forward state of the device. It will in this way be possible, if desired, to apply an extra-layer of a material having totally different physical properties than SiC as said member, and it may in fact be desirable to do so. This is the subject of another preferred embodiment of the invention in which said member is made of a material having a much stronger positive temperature coefficient than SiC, and the on-state resistance of the member is much lower than the resistance of the device at normal operating temperatures of the device. This means that the on-state voltage will not be increased at normal operation temperatures of the device as much as would be the case if the member having a resistance is built in by epitaxy of a layer of SiC, but when the temperature is raised, the much stronger positive temperature coefficient of this material than SiC will result in a comparatively large contribution to the resistive voltage drop of the device, thereby turning the temperature coefficient positive for much lower current densities than without this member.

According to a further preferred embodiment of the invention, the member is connected in series with the device at a distance therefrom. Thus, this indicates that it is within the scope of the invention to connect any type of resistor having the desired physical properties in series with the device to obtain the change of temperature coefficient aimed at, and this embodiment may advantageously be combined with the embodiment last mentioned.

Further advantages and preferred features of the invention will appear from the following description and the other dependent claims.

BRIEF DESCRIPTION OF THE DRAWINGS

With reference to the appended drawings, below follows a specific description of preferred embodiments of the invention cited as examples.

DETAILED DESCRIPTION OF PREFERRED EMBODIMENTS

Figure 3:
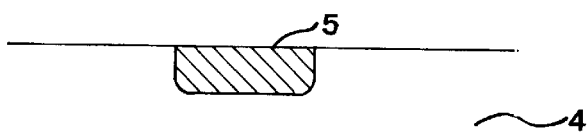
FIG. 3 is a diode according to a preferred embodiment of the invention.
Figure 3:
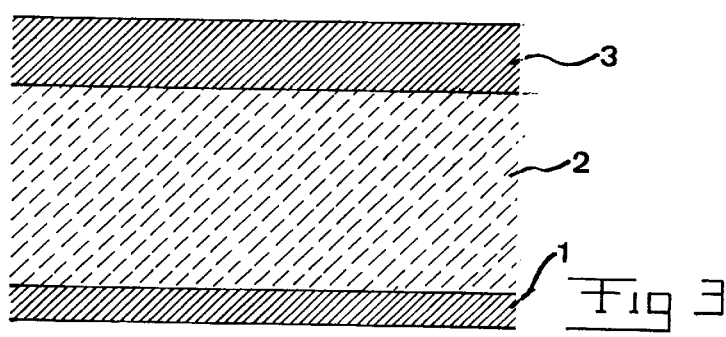

FIG. 3 illustrates a rectifier diode according to a first preferred embodiment of the invention having superimposed a highly doped n-type layer 1 for forming a low ohmic contact to a cathode electrode, a low doped n-type substrate layer 2, a highly doped n-type layer 3, a very lightly doped n-type drift layer 4, and a highly doped p-type layer 5 for hole injection and for forming good ohmic contact with an anode electrode not shown.

The pn-junction is formed by the anode region 5 and the drift layer, and normally the layer 2 having a low doping concentration and being comparatively thick will not be included; instead, a single substrate layer having a comparatively high doping concentration forms a substitute for the layers 1–3. The addition of the layer 2, which accordingly constitutes an extra-layer of SiC built in by epitaxy, will increase the on-state resistance of the device and contribute a resistive part to the total voltage drop over the device.

To obtain this, layer 2 has to be comparatively thick, and in this case it has a thickness of 350 $\mu$m and a doping concentration of $3\times10^{17}cm^{-3}$, which will result in a resistance being suitable to move the cross over point at which the temperature coefficient shifts from negative to positive to an acceptable current density level. This will result in a resistance having a resistivity of about 0.04 $\Omega$cm for a 2.5 kV device. It is, of course, also possible to obtain the same resistivity by making the doping concentration lower and the thickness of the layer 2 thinner, or conversely. Also, the layers 3 and 5 preferably have a doping concentration as high as possible, e.g., about $10^{19}cm^{-3}$. The drift layer will typically have a doping concentration of about $10^{15}cm^{-3}$. It is preferred to have a layer 3, not belonging to the substrate, as the layer making the interface to the drift layer 4, since this means that this layer, which will act as an injecting-emitter, may be grown by epitaxy on top of the substrate 2 in the same growth run as the drift layer, so that a high quality interface will result therebetween. This means that the efficiency of the injection of charge carriers into the drift layer and the carrier life time will increase, so that the electrical properties of the device will become better by using this production method than in prior art rectifier diodes. This is also true in the case of such growing of a layer corresponding to the layer 3 for producing unipolar devices.

Figure 1:
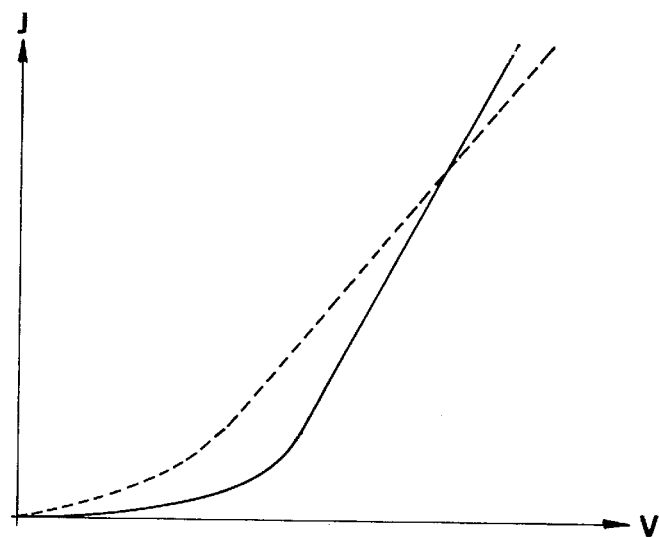
FIGS. 1 and 2 are graphs showing the on-state voltage drop versus the current density for prior art bipolar semiconductor devices of Si and SiC, respectively, at different operation temperatures.
Figure 2:
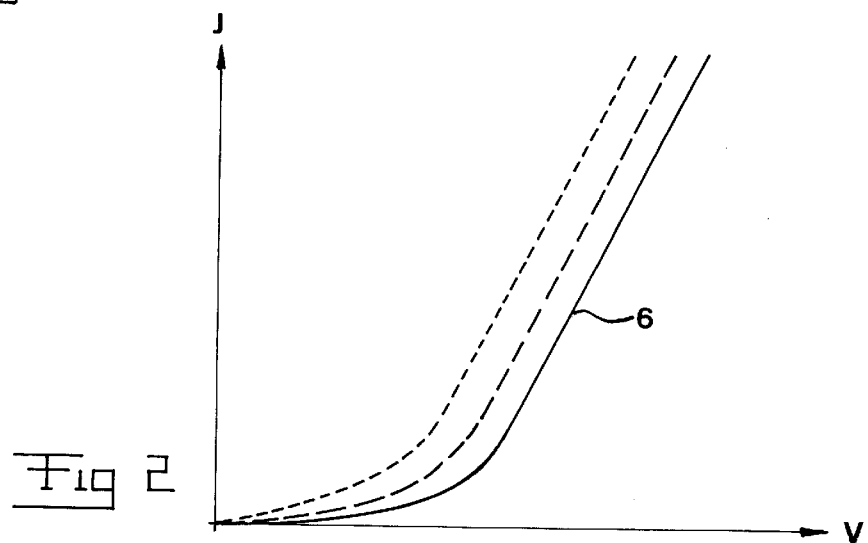
Figure 4:
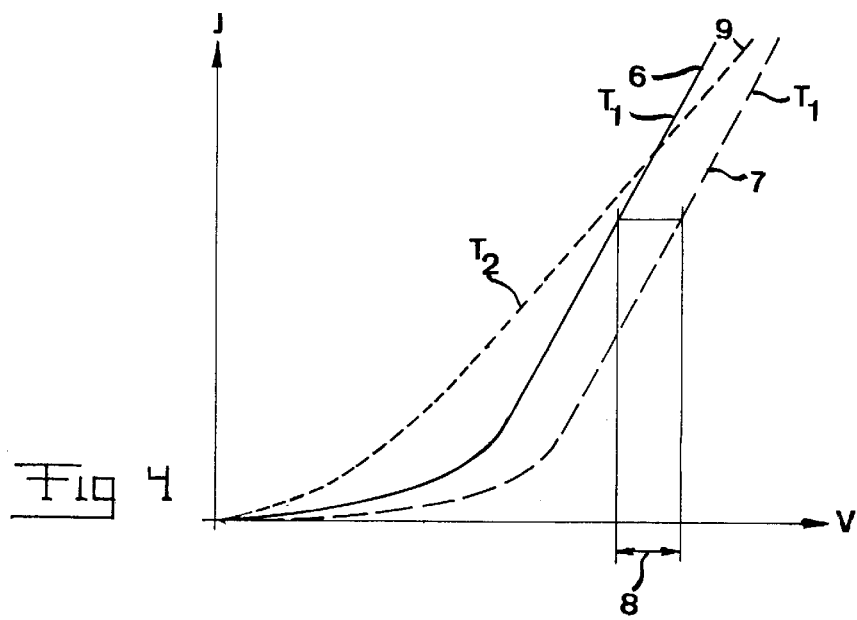
FIG. 4 is a graph corresponding to the graphs of FIGS. 1 and 2 for the diode in FIG. 3.
Figure 5:
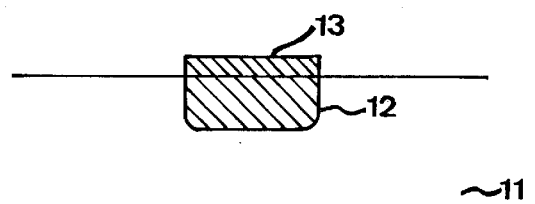
FIG. 5 illustrates a diode according to a second preferred embodiment of the invention.
Figure 5:
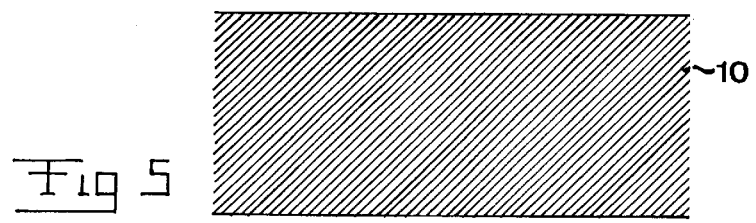

FIG. 4 shows by a continuous line 6 and a dashed line 7 how the total on-state voltage drop over the device will change with changing density of the current therethrough if the extra layer 2 were omitted and there would instead be a highly doped substrate layer as shown for the device in FIG. 5. The dashed line 7 shows the voltage versus the current density for the same temperature $T_1$ as the line 6 of the device shown in FIG. 3, and it illustrates that there will be an addition 8 to the on-state voltage drop of the device, which is an adverse result for producing the extra layer 2. However, dashed line 9 indicates how the extension of the corresponding graph will be for the device in FIG. 3 for a temperature $T_2$ higher than the temperature $T_1$. This graph may be compared to the dashed lines in FIG. 2, which extends substantially in parallel with line 6. FIG. 4 shows how the extension of this line 9 is changed with respect to the dashed lines in FIG. 2, so that the line 9 will cross the line 7 at a much lower current density than without the extra layer 2.

A device according to a second preferred embodiment of the invention is shown in FIG. 5. This device is a rectifier diode having a highly doped n-type substrate layer 10, a low doped n-type drift layer 11, and a highly doped p-type anode layer 12. Furthermore, this diode is provided with an extra-layer 13 in series with the pn-junction formed in the drift layer 11. Also, the layer 13 is made of a material other than SiC, which preferably has a much stronger positive temperature coefficient than SiC, and the resistance of this extra layer 13 is selected to be preferably much lower than the on-state resistance of the device at normal operation temperatures of the device. This means that there will be preferably no increase of the total on-state voltage drop over the device at normal operating temperatures as shown by the dashed line 14 in FIG. 6 following line 6 of an identical device except for the absence of the layer 13. However, as soon as the temperature is raised to a certain extent, the stronger positive temperature coefficient of the layer 13 will result in an increase of the on-state voltage drop over the device being much higher with increasing current densities, as illustrated by the dashed-dotted line 15 for a high temperature $T_2$. Thus, the use of such an extra-layer as said member having a resistance leads to a considerable reduction of the punishment in increased on-state voltage drop at normal operation temperatures.

Figure 6:
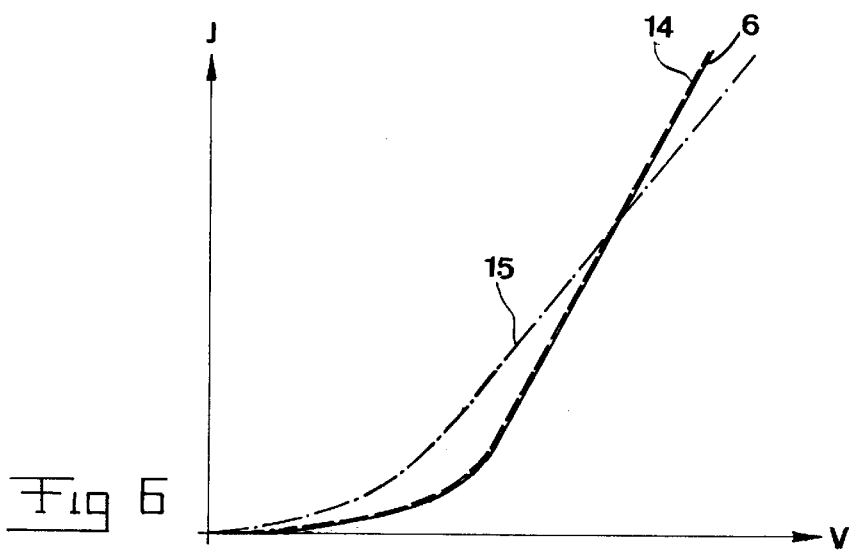
FIG. 6 is a graph corresponding to FIG. 4 for the diode in FIG. 5.
Figure 7:
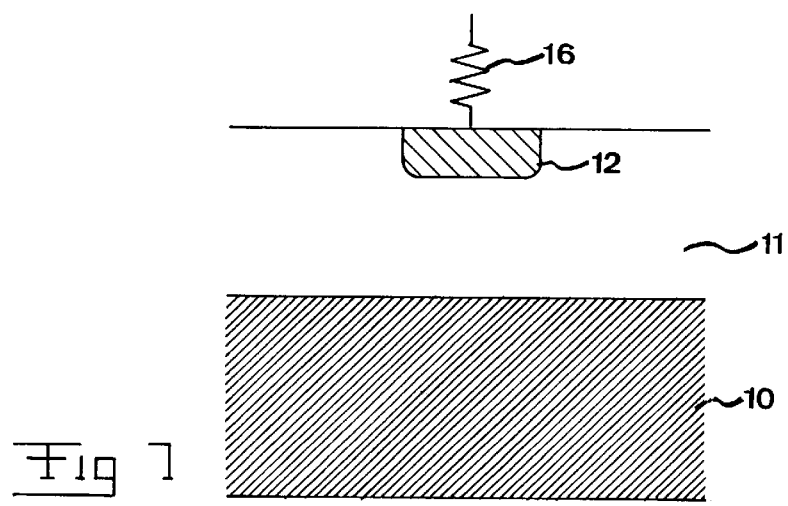
FIG. 7 illustrates a diode according to a third preferred embodiment of the invention.

A rectifier diode according to a third preferred embodiment of the invention is shown in FIG. 7, and this diode is constituted in the same way as the diode shown in FIG. 5, but the extra-layer 13 is replaced by a resistor 16 located at a distance from the rest of the device. This resistor 16 may have the same characteristics as the extra layer 13 in FIG. 5 and the graphs for different temperatures may be the same as shown in FIG. 6 for the device according to FIG. 5. In this case, the resistor 16 is considered to be included when speaking about the total on-state voltage drop over the device.

Figure 8:
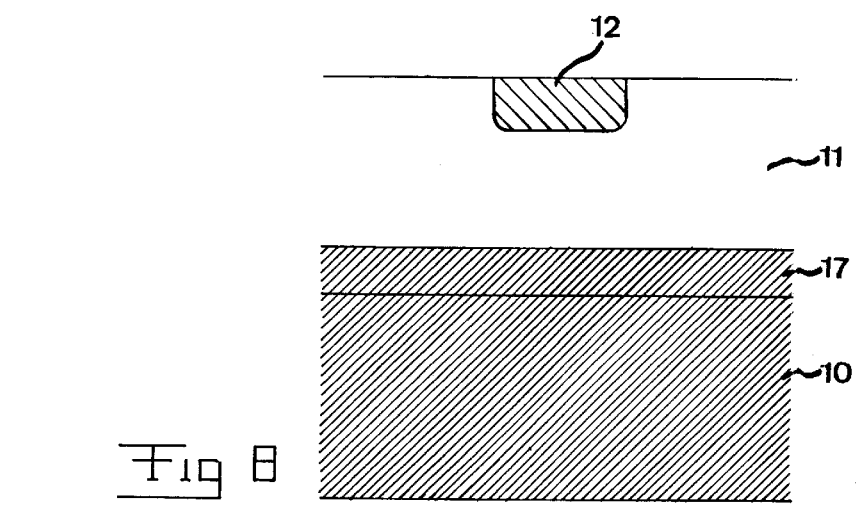
FIG. 8 illustrates a diode grown through a method according to a preferred embodiment of the invention.

FIG. 8 illustrates how a normal rectifier diode or a unipolar device may be produced by using a method according to a preferred embodiment of the invention thoroughly discussed above and which is based upon the step of regrowth of a highly doped n-type layer 17 on top of the substrate layer 10 in the same growth run as the drift layer 11 is grown. The interface between the drift layer 11 and the charge injection layer 17 will, in this way, be at a distance from the interface of lower quality to the substrate 10.

Figure 9:
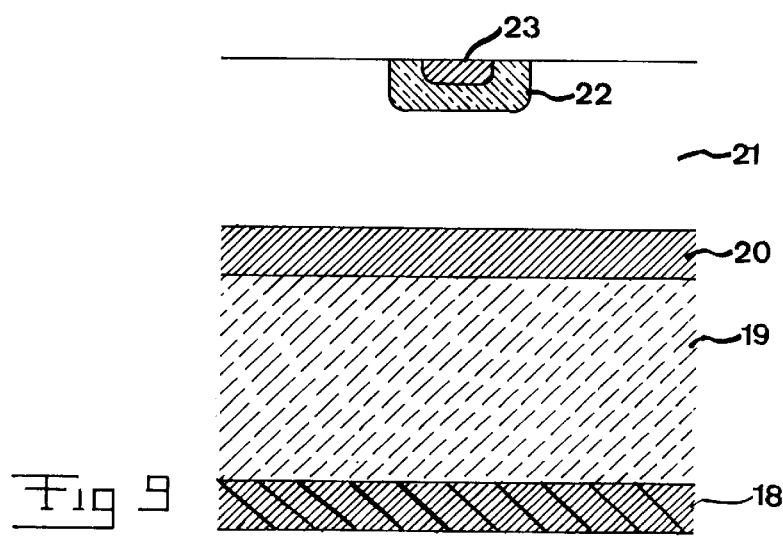
FIG. 9 schematically illustrates an IGBT according to a fourth preferred embodiment of the invention, which has been simplified by omitting source and drain contacts as well as the gate electrode and the gate insulator and passivation layers.

Another bipolar semiconductor device of SiC according to a fourth preferred embodiment of the invention is shown in FIG. 9. This is an IGBT (Insulated Gate Bipolar Transistor), which is formed by having superimposed a highly doped p-type layer 18, a low doped n-type extra-layer 19 corresponding to the layer 2 in the device in FIG. 3, a highly doped n-type layer 20, a very lightly doped n-type drift layer 21, a p-type base layer 22, and a highly doped n-type source region layer 23. Some other details as source, gate, gate insulating layer and so on, having nothing to do with the invention, are left out. The on-state characteristics of such an IGBT can be viewed as consisting of two segments: a diode drop portion followed by a resistive portion. The diode voltage drop increases when the temperature is increased. This behavior is typical for a diode, where the injection across the pn-junction becomes more favorable with increasing temperature. At the same time, the resistance of the second segment increases when the temperature increases. The influence of the extra-layer 19, having a resistance on the voltage over the current density curve, will be the same as the corresponding influence of the layer 2 in the device according to FIG. 3.

The invention is of course not in any way restricted to the preferred embodiment described above, but many possibilities to modification thereof would be apparent to one with ordinary skill in the art without departing from the basic idea of the invention.

It is emphasized that the thicknesses of the different layers in the figures cannot be interpreted as limiting the scope of protection, but any thickness relations are intended to be covered by the claims.

The dopants used for this application may be of any material suitable as dopants in this art.

The independent patent claim concerning the method for producing a semiconductor device does not, of course, include every step necessary for producing such a device, but several conventional steps of semiconductor technologies will also be used. It is also pointed out that this method covers the production of unipolar devices as well as bipolar devices.

"Substrate layer" is, in this disclosure, to be interpreted as a layer next to the drain with exception for a possible layer for forming a good ohmic contact to the drain of the layers mentioned and it does not have to be a substrate layer in the strict sense of the word within this field, i.e., the layer from which the growth is started. The real substrate layer may be any of the layers and is mostly the thickest one.

We claim:

1. A bipolar semiconductor device having semiconductor layers of SiC and at least one pn-junction with charge carrier transport between two of such layers across said junction in a conducting state of the device, and a resistive element in series with said pn junction for lowering the current through said pn junction as the voltage drop across said device increases with an increase in temperature, wherein the temperature coefficient for said device switches from a negative to a positive at a lower current.

2. A device according to claim 1 wherein said element is an extra-layer of SiC having a considerable resistance with respect to the on-state resistance of the device.

3. A device according to claim 2, wherein said extra-layer is thick in the direction of the current flow in the forward state of the device with respect to other layers of the device.

4. A device according to claim 3, wherein said thickness is over 200 $\mu$m.

5. A device according to claim 2, wherein the doping concentration of said extra-layer is low.

6. A device according to claim 5, wherein the doping concentration of said extra-layer is below $5 \times 10^{17}$ cm$^{-3}$.

7. A device according to claim 2 wherein the thickness of said extra-layer is about 350 $\mu$m, and the doping concentration of said extra-layer is between $1 \times 10^{17}$ cm$^{-3}$ and $5 \times 10^{17}$ cm$^{-3}$.

8. A device according to claim 1, wherein said element has a resistivity of 0,02–0,08 $\Omega$cm.

9. A device according to claim 2, including a doped n-type substrate layer which includes said extra-layer as a sub-layer.

10. A device according to claim 9, further including a highly doped n-type layer arranged on top of said extra-layer for efficient charge injection into a low doped n-type drift layer of the device arranged between the top of said highly doped layer and said pn-junction of the device.

11. A device according to claim 1, wherein said element is an extra-layer of a material other than SiC placed on one end of the device in the direction of the current flow through the device in the forward state of the device.

12. A device according to claim 1, wherein said element is connected in series with the device at a distance from said layers of SiC.

13. A device according to claim 11, wherein said element is made of a material having a much stronger positive temperature coefficient than SiC, and that the resistance of said element is much lower than the on-state resistance of the device at normal operation temperatures of the device.

14. A device according to claim 3 wherein said thickness is over 300 $\mu$m.

* * * * *